United States Patent
O'Hara (10) Patent No.: US 8,679,354 B2
(45) Date of Patent: Mar. 25, 2014

(54) METHOD OF ETCHING A SACRIFICIAL SILICON OXIDE LAYER

(75) Inventor: Anthony O'Hara, Livingston (GB)

(73) Assignee: Memsstar Limited (GB)

(*) Notice: Subject to any disclaimer, the term of this patent is extended or adjusted under 35 U.S.C. 154(b) by 96 days.

(21) Appl. No.: 12/375,745

(22) PCT Filed: Aug. 2, 2007

(86) PCT No.: PCT/GB2007/002932
§ 371 (c)(1),
(2), (4) Date: Jan. 30, 2009

(87) PCT Pub. No.: WO2008/015434
PCT Pub. Date: Feb. 7, 2008

(65) Prior Publication Data
US 2009/0308843 A1    Dec. 17, 2009

(30) Foreign Application Priority Data
Aug. 2, 2006    (GB) .................................. 0615343.1

(51) Int. Cl.
*C23F 1/00*    (2006.01)

(52) U.S. Cl.
USPC ....... 216/2; 216/11; 216/63; 216/73; 438/708

(58) Field of Classification Search
None
See application file for complete search history.

(56) References Cited

U.S. PATENT DOCUMENTS

| | | | |
|---|---|---|---|
| 4,749,440 A * | 6/1988 | Blackwood et al. ......... | 438/706 |
| 5,013,693 A | 5/1991 | Guckel | |
| 6,065,481 A * | 5/2000 | Fayfield et al. ................ | 134/1.3 |
| 6,162,734 A * | 12/2000 | Bergman et al. .............. | 438/706 |
| 6,238,580 B1 * | 5/2001 | Cole et al. ......................... | 216/2 |
| 6,558,559 B1 * | 5/2003 | Becker et al. ..................... | 216/2 |

(Continued)

FOREIGN PATENT DOCUMENTS

| | | |
|---|---|---|
| EP | 1081093 A1 | 3/2001 |
| WO | WO 2005034205 A2 * | 4/2005 |

OTHER PUBLICATIONS

Christopher W. Storment, et al, Flexible, Dry-Released Process for Aluminum Electrostatic Acutators, Sep. 1994, Journal of Microelectromechanical Systems, vol. 3, No. 3, p. 90-96.*

(Continued)

*Primary Examiner* — Binh X Tran
*Assistant Examiner* — David Cathey, Jr.
(74) *Attorney, Agent, or Firm* — Workman Nydegger (57) ABSTRACT

A controlled method of releasing a microstructure comprising a silicon oxide layer located between a substrate layer and a layer to be released from the silicon oxide layer is described. The method comprises the step of exposing the silicon oxide layer to a hydrogen fluoride vapor in a process chamber having controlled temperature and pressure conditions. A by-product of this reaction is water which also acts as a catalyst for the etching process. It is controlled employment of this inherent water source that results in a condensed fluid layer forming, and hence etching taking place, only on the exposed surfaces of the oxide layer. The described method therefore reduces the risk of the effects of capillary induced stiction within the etched microstructure and/or corrosion within the microstructure and the process chamber itself.

16 Claims, 6 Drawing Sheets

(56) References Cited

U.S. PATENT DOCUMENTS

| | | |
|---|---|---|
| 6,740,247 B1 | 5/2004 | Han et al. |
| 6,911,348 B1 * | 6/2005 | Becker et al. .................. 438/10 |
| 6,936,183 B2 | 8/2005 | Chinn et al. |
| 7,365,016 B2 * | 4/2008 | Ouellet et al. ................ 438/706 |
| 2001/0034076 A1 | 10/2001 | Martin |
| 2003/0080082 A1 * | 5/2003 | Chinn et al. ..................... 216/2 |
| 2003/0080087 A1 * | 5/2003 | Stelzle ............................ 216/27 |
| 2004/0259370 A1 * | 12/2004 | Bergman ...................... 438/708 |
| 2005/0106318 A1 | 5/2005 | Partridge |

OTHER PUBLICATIONS

P. P R. Scheeper, et al, Investigation of attractive forces between PECVD silicon nitride microstructures and an oxidezed silicon substrate, 1992, Sensor and Actuators A, Elsevier sequoia, p. 231-239.*

Written Opinion of the International Searching Authority for PCT/GB2007/002932, dated Feb. 2, 2009, 7 pages.

* cited by examiner

METHOD OF ETCHING A SACRIFICIAL SILICON OXIDE LAYER

The present invention relates to a method for use in the manufacturing of microstructures. Typically, the microstructures are in the form of micro electromechanical systems (MEMS) that require the removal of a material relative to a substrate or other deposited material. In particular, this invention relates to an improved method for the control of the etching process involved in the manufacture of these microstructures.

Figure 1:
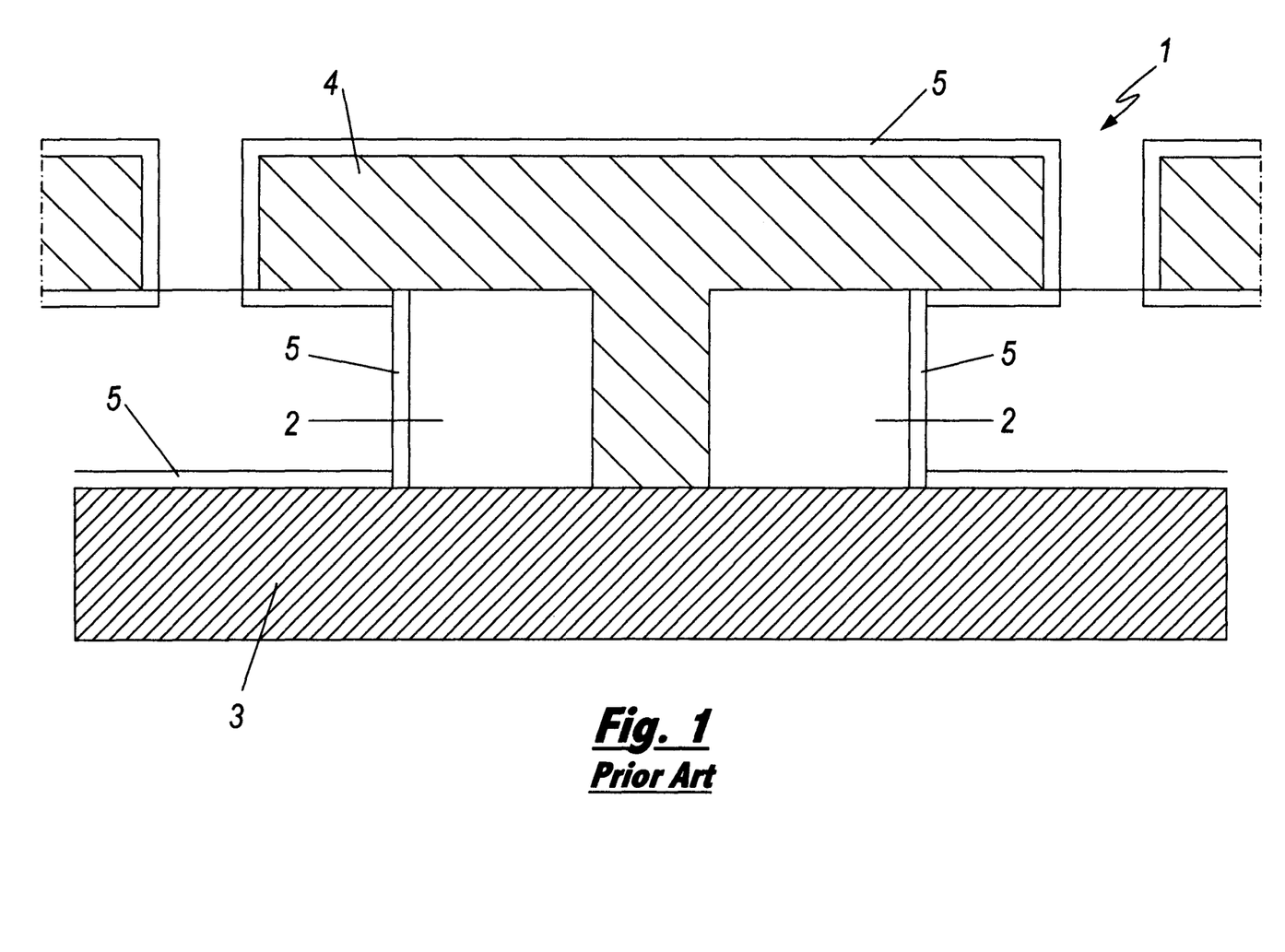
FIG. 1 presents a schematic representation of a dry etch employing a water vapour catalyst of a MEMS structure that comprises a silicon oxide layer located between a silicon-containing substrate and a release layer.

Isotropic etching of silicon oxides is widely used in semiconductor and MEMS processing, primarily in wafer cleaning and release processes. For illustrative purposes FIG. 1 presents a schematic representation of a partially etched MEMS structure 1 that comprises a silicon oxide layer 2 (of approximately 1 μm thickness) located between a silicon-containing substrate 3 and a release layer 4.

As is known to those skilled in the art a variety of silicon oxides can be deposited or grown within these devices by employing various techniques. These silicon oxides may be undoped, or doped with a variety of dopants e.g. boron or phosphorous. Typical useful silicon oxides include phosphosilicate glass (PSG); borophosphosilicate glass (BPSG); silicon oxide deposited from tetraethoxysilane (TEOS). The various silicon oxide layers have different properties that depend on the type of film and the technique used in its deposition. One property of particular interest is how hygroscopic or dense the layer can be. In practice, it is found that differently doped, or formed, silicon oxides vary as to the amount of moisture absorbed or adsorbed within the film or on their surface during a subsequent etching process.

The release layers 4 are typically structures formed from polysilicon or metals e.g. aluminium or copper. In the present example they are shown as T-shaped structures, however as will be appreciated by those skilled in the art a variety of structures may alternatively be employed.

Historically, the isotropic etching processes of silicon oxides were liquid based, principally using various concentration of hydrofluoric acid due to the high selective etch of silicon dioxide when compared with silicon. This reaction is described by equation (1) below:

$$4HF + SiO_2 \xrightarrow{catalyst} SiF_4 + 2H_2O \quad (1)$$

Wet etching involves the complete emersion of the sample in a bath containing the appropriate concentration of hydrofluoric acid. This is a desirable process since it produces high etching rates, typically ~10,000 Å/min, although the precise rate depends on the actual form of the MEMS structure 1.

However, wet release processing suffers from some fundamental problems. The primary problem is capillary induced stiction. With the etch complete the liquid etchant must be removed. Often this is done using a simple drying technique. However, as the liquid is removed the surface tension of the remaining liquid can pull adjacent structures together. When these structures touch the surface forces, in the form of van der Waals forces, can be strong enough that the surfaces will not separate. Techniques have been developed to get round this problem by employing critical point drying.

A further problematic feature of wet hydrofluoric acid etching relates to the fact that the selectivity of hydrofluoric acid with non-silicon materials is often not as good as that with respect to silicon. In particular, hydrofluoric acid is known to corrode many commonly employed metals during etching e.g. aluminium and copper. As a result, wet etching can also result in unwanted damage to a MEMS structure 1 and in particular corrosion of the exposed surfaces of the release layer 4.

An alternative to wet etching is dry etching or vapour phase etching. These etching techniques are sometimes employed by those skilled in the art since they are known to minimise or eliminate the effects of stiction. In these techniques anhydrous hydrogen fluoride gas is delivered to a process chamber where etching can occur. For etching to occur a catalyst must be present which is also delivered in gaseous form.

The dry etch approaches currently described in the art fall into two distinct regimes, one where water vapour is used as the catalyst for the reaction, and the other where an alcohol, such as methanol, is used as the catalyst. These two approaches result in two distinct processing conditions both with their benefits and drawbacks.

Using water vapour as the catalyst invariably results in a condensed fluid layer 5 being produced around all of the exposed surfaces of the sample, as presented schematically in FIG. 1. HF gas and water vapour are supplied to the process chamber to induce etching. Since the etch reaction also produces water vapour this often results in an excess of water vapour being present. No facility to control the water vapour within the chamber, and particularly at the sample, is provided within such techniques. As a result there exists a significant risk of capillary induced stiction due to the presence of the condensed fluid layer 5. Furthermore, as the etch proceeds, and the released structure in some cases becomes more flexible, the chances of capillary induced stiction further increases. It is believed by those skilled in the art that at this point it is advisable to eliminate the condensed fluid layer 5 and this can be done by removing the supply of water vapour to the process chamber.

This process, where there is uncontrolled excess of water vapour can be considered in many respects to be similar to the above described wet etching. It produces high etch rates but suffers from metal corrosion and does not significantly reduce the chances of capillary induced stiction occurring.

Water vapour catalyst dry etching and wet HF etching also exhibits further problematic features. An additional inherent problem with these etching processes is that as the etching proceeds, adherent residues form as by-products on the substrate 3 and the released layer 4. Residues are known to be particularly problematic when etching an oxide so as to expose a silicon nitride surface. The presence of these residues can result in van der Walls and electrostatic attraction between the released layer 4 and the substrate 3. These attractive forces can cause collapse of the MEMS structure 1. In effect, the T-shaped structures bend under these attraction forces down toward the substrate, and then stick to it, often permanently.

When employing alcohol as the catalyst in a dry etching process the resulting reaction is again described by equation (1). In this regime, chamber conditions are set to ensure that a condensed fluid layer 5 does not form at all on the MEMS structure 1. This is aided by the use of the alcohol as the catalyst, since alcohols exhibit lower vapour pressures than water and also act to reduce the capillary forces. However, associated yields for such processes are low since the associated etch rates are again significantly lower than with wet etching techniques, a fact that is reflected in those systems known in the art.

U.S. Pat. No. 6,740,247 in the name of Massachusettes Institute of Technology teaches of an example of a modified HF vapour wafer cleaning and oxide etching technique. This technique controls the temperature and pressure conditions of a process chamber, into which hydrogen fluoride gas and water vapour are added, such that no more than a sub-monolayer (~1-5 Å depth) of etch reactants and products produced by the vapour is formed on the substrate as it is processed within the chamber. As described by the authors, this process results in an etch rate of the order of 10 Å/min. Thus, although a highly uniform, reproducible and predictable etch and cleaning process is produced for blanket wafers, the resultant etch rates produced are also far too low to be viably employed within any commercial application. Furthermore, the described method is not readily adaptable for use with more complex MEMS structures 1 e.g. the type shown in FIG. 1.

U.S. Pat. No. 6,936,183 in the name Applied Materials Inc. teaches of a two-step method for releasing a MEMS structure from a substrate. The first step comprises isotropically etching a silicon oxide layer sandwiched between two silicon-containing layers with a dry HF etching process with water as the catalyst for a time sufficient to form an opening, but not sufficient to release the overlying layer. The second step then comprises switching to a completely alcohol catalyst based dry etching process by adding a drying agent to substitute for moisture remaining in the opening and to dissolve away any residue in the opening that can cause stiction.

The described method provides etching rates greater than those produced with either full dry etching processes with an alcohol catalyst or the method described within U.S. Pat. No. 6,740,247. However, as periodic switching to an alcohol catalyst based dry etching process is employed the etch rates are still lower than for those achieved with full wet etching processes. In addition, this technique is a somewhat cumbersome solution that requires detailed knowledge of the structure being produced such that the correct timing for the switching between the steps can be obtained. As will be readily apparent, such prior knowledge of the MEMS structure to be etched is not always available. Furthermore, the HF etch phase with water vapour as the catalyst exhibits no apparent control of the condensed fluid layer 5 formation for the same reasons as described above. Thus, there is again an excess of water vapour and the condensed fluid layer 5 is again formed on all of the exposed surfaces during this phase of the process.

It is therefore an object of the present invention to provide a reliable method of releasing a feature from a microstructure while still maintaining a high etch rate.

SUMMARY OF INVENTION

According to a first aspect of the present invention there is provided a method of releasing a microstructure comprising a silicon oxide layer located between a substrate layer and a layer to be released from the silicon oxide layer, the method comprising the step of exposing the silicon oxide layer to a hydrogen fluoride vapour in a process chamber having controlled temperature and pressure conditions such that a controlled condensed fluid layer is formed on the exposed surfaces of the oxide layer.

The careful control of the quantities of the hydrogen fluoride vapour introduced into the chamber, as well as the selection of the temperature and pressure conditions, provides a means for the HF to react with the exposed surfaces of the silicon oxide layer. A by-product of this reaction is itself water. Therefore, this inherent source of water can be utilised to confine the etching condensed fluid layer to the exposed surfaces of the silicon oxide layer and thus no condensed fluid layer is produced at unwanted sites within the microstructure. This provides the benefit of reducing the risk of the effects of stiction or corrosion of incompatible release layer materials.

Preferably the method further comprises the step of exposing the silicon oxide layer to a water vapour.

In practice it is found that water vapour may be required to initiate the etching process. Furthermore, it can also be useful to have access to an external water vapour source so as to provide additional control to the etching rate i.e. water vapour can be introduced if the etch rate of the oxide layer drops below a predetermined value.

Most preferably the method further comprises the formation of the condensed fluid layer having a depth of at least 10 Å. Preferably the condensed fluid layer has a depth of at least 100 Å.

Preferably the method further comprises the formation of the condensed liquid layer having a depth less than a predetermined maximum value.

The predetermined maximum value is defined by the physical dimensions of the microstructure to be etched and is chosen to minimise the risks of capillary induced stiction. Typically the predetermined maximum value will be of the order of 0.2 µm.

Most preferably the method further comprises the step of monitoring the depth of the condensed fluid layer. Preferably the method further comprises adjusting one or more process chamber parameters so as to maintain the depth of the condensed liquid layer between 10 Å and the predetermined maximum value.

Preferably the step of monitoring the depth of the condensed fluid layer comprises the step of monitoring the etch rate of the silicon oxide layer.

Most preferably step of monitoring the etch rate comprises the step of monitoring the temperature of the micromechanical structure. This is a viable option for monitoring depth of the condensed fluid layer as the reaction of hydrofluoric acid and silicon oxide is an exothermal process.

Most preferably the step of adjusting one or more process chamber parameters comprises the selection of one or more steps from the group of steps comprising:
  a) altering the temperature of the micromechanical structure;
  b) altering the process chamber pressure;
  c) altering the partial pressure of the water vapour;
  d) exposing the silicon oxide layer to an alcohol vapour (e.g. methanol vapour or isopropyl alcohol vapour); and
  e) altering the partial pressure of the HF vapour.

Optionally the method further comprises the step of oxidising the exposed surfaces of the silicon oxide layer. Oxidising the exposed surfaces of the silicon oxide layer has the advantage that it renders these surfaces more hydrophilic. This helps the condensed liquid layer to wet so producing a thinner more even layer and thus improving the etch uniformity while reducing the thickness of the condensed liquid layer.

Preferably the step of oxidising the exposed surfaces of the silicon oxide layer comprises exposing these surfaces to an oxygen plasma.

Preferably the method further comprises the step of exposing the microstructure to a reactive plasma chemistry. This step allows for the plasma to react with any residues e.g. boron and phosphorus to produce volatile compounds which are gaseous and so can be easily removed from the structure.

Optionally the method further comprises the step of introducing an organic vapour to the surfaces exposed by the etching process so as to render these hydrophilic. This step acts to deter water beading on the exposed surface so reducing the risk of capillary induced stiction. Suitable organic vapours for this step include 2-[methyoxy(polyethyleneoxy)propyl]heptamethyltrisiloxane.

Alternatively, the method further comprises the step of introducing an organic vapour to the surfaces exposed by the etching process so as to render these hydrophobic. This step acts to deter water forming on exposed surfaces that are susceptible to corrosion. Suitable organic vapour[s] for this step include, tridecafluoro-1,1,2,2-tetrahydrooctyltrichlorosilane and heptadecafluoro-1,1,2,2-tetrahydrodecyltrichlorosilane.

BRIEF DESCRIPTION OF DRAWINGS

Aspects and advantages of the present invention will become apparent upon reading the following detailed description and upon reference to the following figures in which.

SPECIFIC DESCRIPTION

Figure 2:
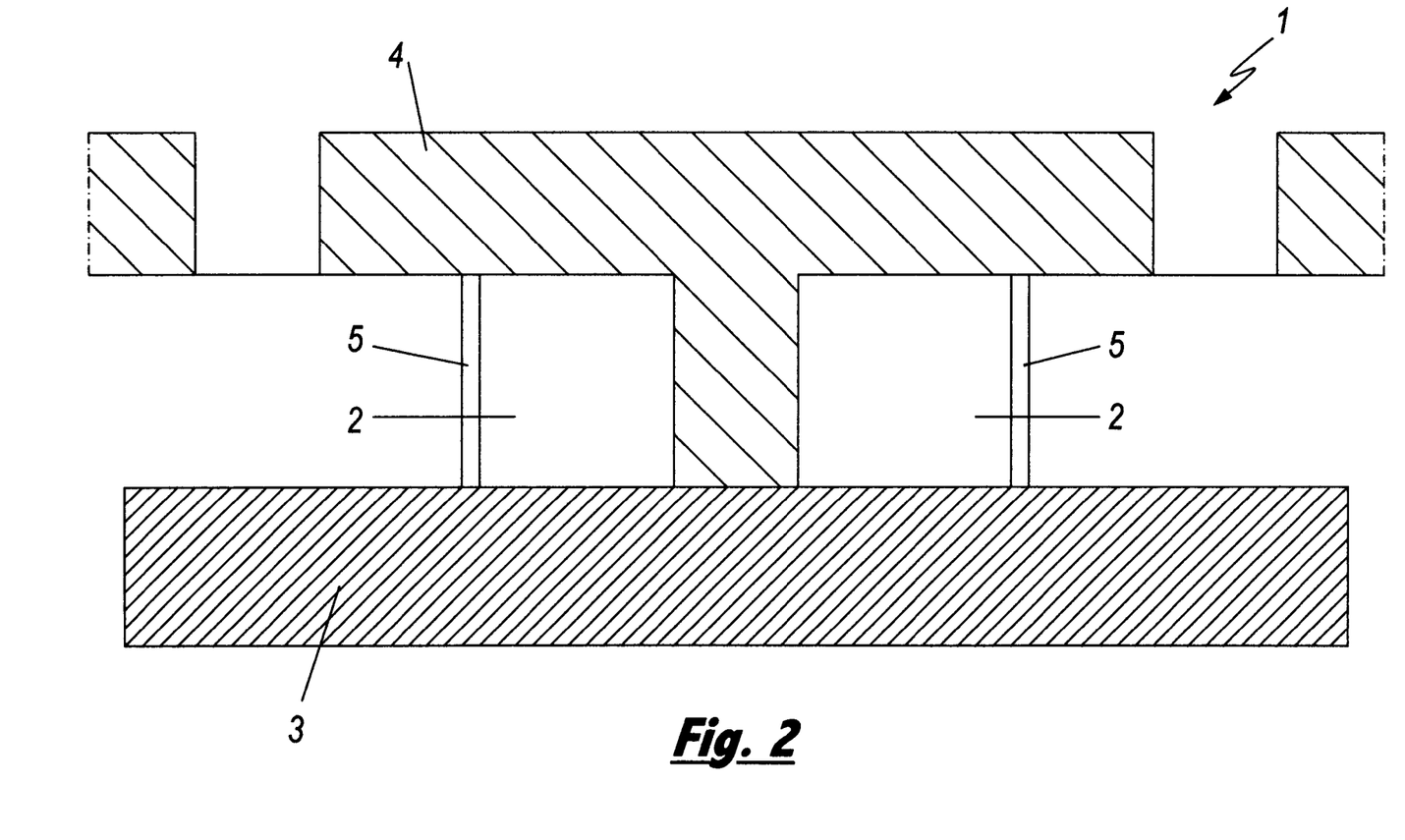
FIG. 2 presents a schematic representation of the MEMS structure of FIG. 1 being etched in accordance with the method of an aspect of the present invention.

FIG. 2 presents a schematic representation of a partially etched microstructure, namely a MEMS structure 1, being etched in accordance with a method of an aspect of the present invention. The MEMS structure 1 is of the same form as that presented previously within FIG. 1 and therefore for clarity purposes like reference numerals are employed within this Figure and throughout the following description e.g. a silicon oxide layer 2 located between a silicon-containing substrate 3 and a release layer 4 formed from aluminium.

The following described method of etching is based on the careful control of a process chamber's conditions (described in detail below) so as to provide an accurate formation and subsequent control of the condensed fluid layer 5 to only those surfaces of the oxide layer 2 exposed for etching.

As detailed in Equation (1), water is a by-product of the etch of a silicon oxide. As a result, the depth of the condensed fluid layer 5 is influenced by the material being etched since the amount of water produced as a by-product is dependent on the particular oxide being etched. However, irrespective of what silicon oxide is being etched the chamber conditions can be arranged so that the by-product water produced is the primary source of water required for the formation of the condensed fluid layer 5. Thus, this inherent source of water can be utilised to confine the etching condensed fluid layer 5 to the exposed surfaces of the silicon oxide layer and thus no condensed fluid layer 5 is produced at unwanted sites within the MEMS structure 1 where it could result in detrimental stiction or corrosion of incompatible materials. An external water vapour source may however be provided to initiate the reaction and/or to sustain the reaction if and when required. If too much water is present then the other chamber parameters can likewise be modified, as appropriate.

Figure 3:
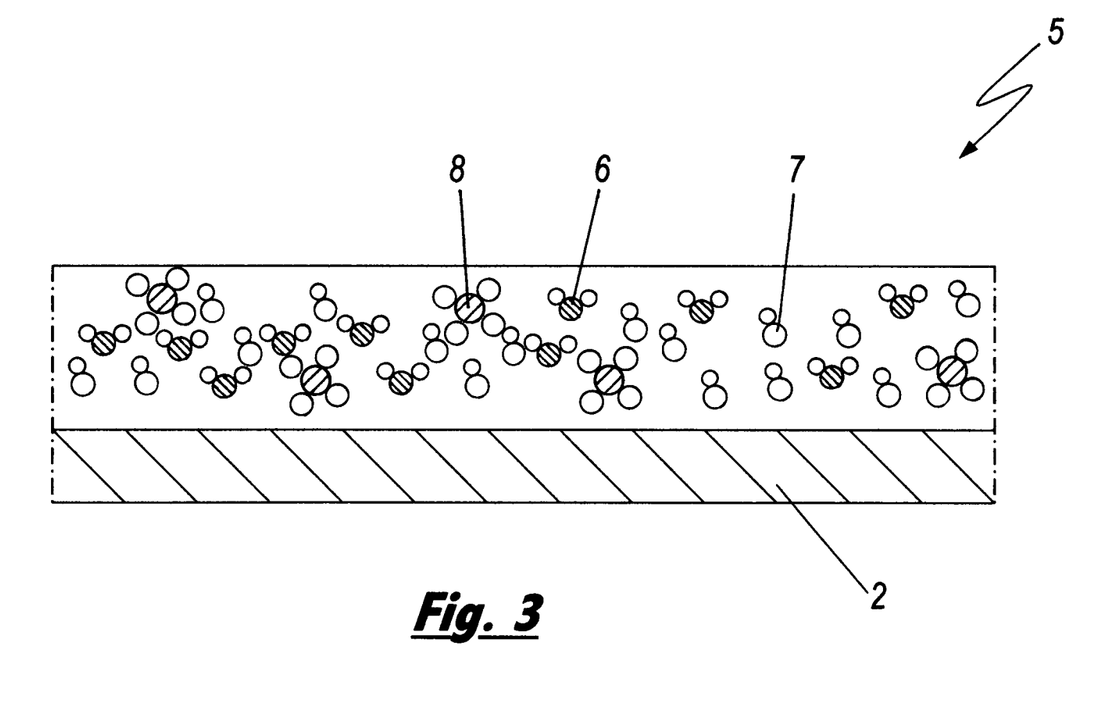
FIG. 3 presents a schematic representation of a condensed fluid layer formation of the partially etched MEMS structure of FIG. 2.
Figure 4:
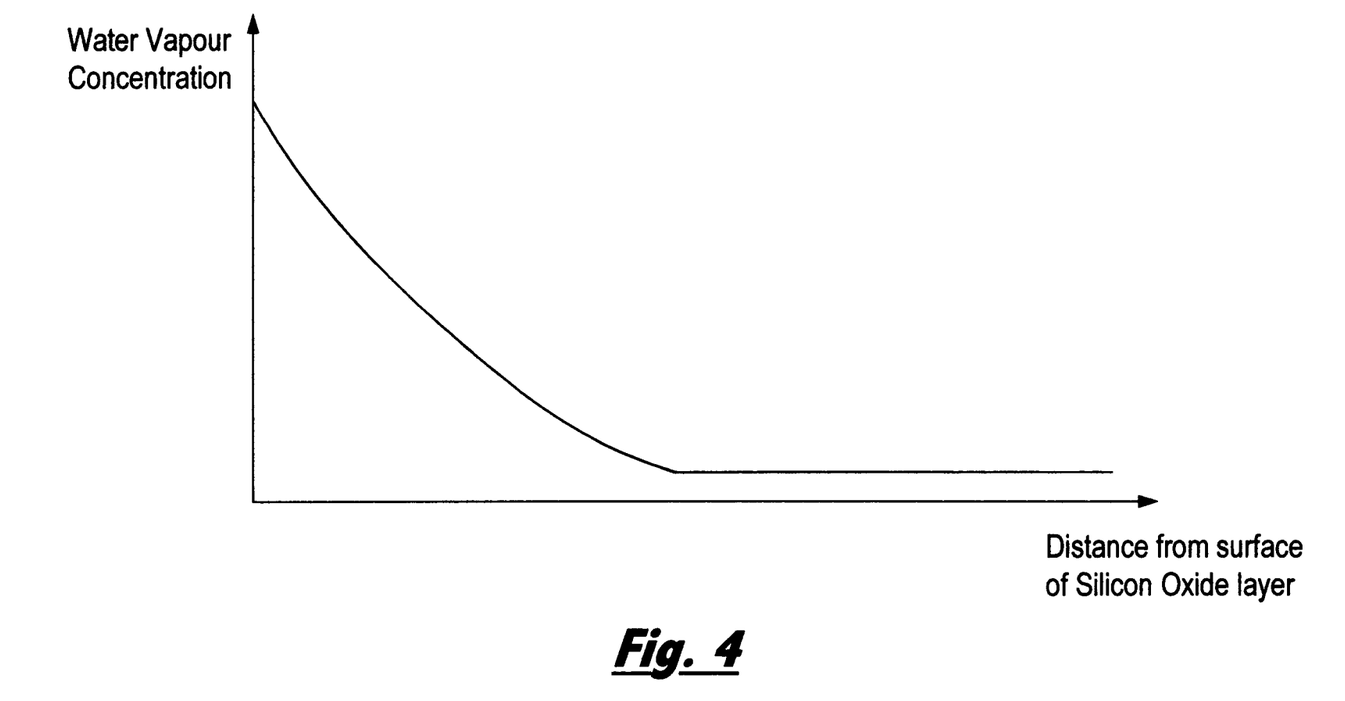
FIG. 4 presents a graph illustrating the water vapour concentration versus distance from the surface of the silicon oxide layer.

Further details of the condensed fluid layer 5 can be seen from the schematic representation of this layer presented in FIG. 3. The condensed fluid layer 5 can be considered as a layer containing etch reactants, water ($H_2O$) 6 and HF molecules 7, and by-products produced as the etch progresses e.g. silicon tetrafluoride ($SiF_4$) molecules 8. In order to provide high enough concentrations of reactants so as to produce etch rates of a sufficient level for commercial applications i.e. ~1000-5,000 Å/min the condensed fluid layer 5 is required to be allowed to form to a depth of at least 10 Å, although it is preferable for this depth to be at least 100 Å. The maximum depth of the condensed fluid layer 5 is predominately defined by the MEMS structure 1 to be etched. However, if there is too much liquid capillary induced stiction can occur. To help illustrate this point FIG. 4 presents a plot of water vapour concentration versus distance from the surface of the silicon oxide layer for the MEMS structure 1 of FIG. 2.

Considering capillary induced stiction in more detail, as a liquid evaporates the remaining liquid forms in as small a volume as possible. However, the liquid in contact with the structure surfaces is being attracted by strong surface forces. The liquid contracts as the volume is reduced during evaporation. Thus, if the surface contact is strong this effect can pull the surfaces together and induce stiction. Capillary induced stiction is thus dependent on a number of factors. The amount of liquid present, the contact area, the surface forces and the mechanical restoring force of the structure.

Controlling the condensed fluid layer 5 limits the amount of liquid present and the surface contact area both of which help reduce the occurrence of capillary induced stiction. Also, the location of the condensed fluid layer 5 is at the etch site which is closest to where the structure is being supported. In this position the fluid present and the effect of evaporation has the lowest influence on pulling together adjacent surfaces.

In the presently described embodiment depths of greater than 0.2 μm would start to render the MEMS structure 1 susceptible to the effects of capillary induced stiction. In practice a condensed fluid layer 5 depth of ~0.1 μm is found to provide an etching rate of ~3,000 Å/min.

Figure 5:
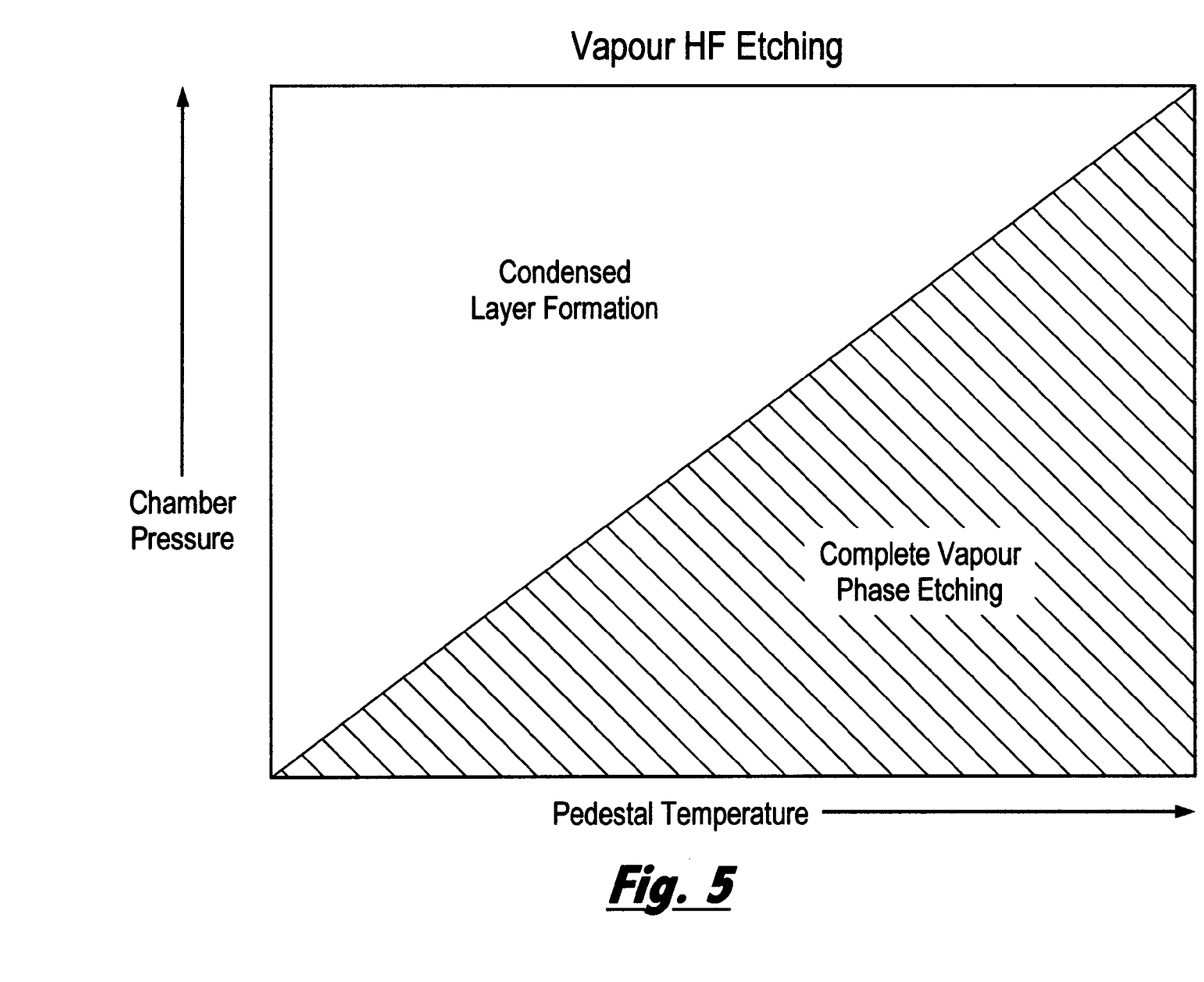
FIG. 5 presents a graph illustrating the effects of chamber pressure and temperature on the HF etching rate within the chamber of FIG. 2.

As referred to above, a number of factors influence the formation of the condensed fluid layer 5. For example the presence and control of the condensed fluid layer 5 is influenced by the temperature of the MEMS structure 1, the gas flows to the process chamber and the chamber pressure itself. The condensed fluid layer 5 is also highly influenced by the surface properties of the exposed material. The control of condensed fluid layer 5 can therefore be viewed as moving between a vapour and liquid phase as represented graphically in FIG. 5. The effect of varying the chamber parameters to the formation of condensed fluid layer 5 can thus be summarised as follows:

a) Increasing the temperature of the MEMS structure 1 moves the process window towards the gas phase and so reduces the depth of the condensed fluid layer 5;

b) Increasing the process chamber pressure moves the process window towards the liquid phase and so promotes the formation of the condensed fluid layer 5;

c) Increasing the partial pressure of the water vapour promotes the formation of the condensed fluid layer 5;

d) Replacing the water vapour with an alcohol vapour (e.g. methanol vapour or isopropyl alcohol vapour) diminishes the formation of the condensed fluid layer 5; and e) Increasing the partial pressure of the HF promotes the formation of the condensed fluid layer 5.

As referred to above, the formation of the condensed fluid layer 5 is also influenced by the inherent properties of the material being etched. For example, a hydrophilic surface helps the condensed fluid layer 5 to wet so producing an even layer and thus improving etch uniformity while reducing the thickness of the condensed fluid layer 5. One method for generating a hydrophilic surface is to expose the surface to an oxygen plasma. Following this surface preparation the material can then be etched. This cycle can be repeated so as to help maintain control of the properties of the condensed fluid layer 5.

Such a control step may be desirable within the MEMS structure 1 since the sacrificial oxide layer 2 is inherently hydrophilic. Furthermore, where other materials are present or become exposed during etching then the surface properties can also change e.g. when areas of the substrate 3 become exposed. These materials are generally more hydrophobic than the oxide layer 2 and so promote beading of the condensed fluid layer 5. This increases the maximum depth of the condensed fluid layer 5 which could result in contact with adjacent surfaces thereby inducing stiction. A similar effect can happen when exposing residues which again can promote beading.

To address the problematic issue of exposure of underlying surfaces, which are hydrophobic and thus promote beading a suitable vapour that interacts with the water vapour can be introduced to the chamber. For example an organic vapour such as 2-[methyoxy(polyethyleneoxy)propyl]heptamethyltrisiloxane can be employed. A hydrophilic surface can therefore be imparted to the exposed surfaces which deters the water vapour from beading and inducing stiction.

Alternatively, if the underlying exposed surface is susceptible to corrosion then it is desirable for this surface to be rendered hydrophobic. This is again achieved though the introduction of an organic vapour which interacts with the water vapour in the chamber so deterring the water vapour from condensing on the exposed surface. An example of an organic vapour suitable for this function is tridecafluoro-1, 1,2,2-tetrahydrooctyltrichlorosilane and heptadecafluoro-1, 1,2,2-tetrahydrodecyltrichlorosilane. This introduction of this organic vapour thus acts to pacify the HF etch on these surfaces susceptible to corrosion.

As will be appreciated by those skilled in the art, the etching of doped silicon oxides such as PSG, BSG and BPSG results in residues being left behind. To remove these etch by-products rinse waters are traditionally employed. However, as described in the introduction, employing rinse waters heightens the risks of capillary induced stiction. Therefore, within the present method a highly reactive plasma chemistry is introduced to the chamber using a remote plasma unit. The plasma reacts with the residues e.g. boron and phosphorus to produce volatile compounds which are gaseous and so can be pumped away with the vacuum system. Such a step therefore removes the unwanted residues without rendering the MEMS structure 1 susceptible to stiction. This residue removal step can be performed either in the same processing chamber or in a separate dedicated chamber. Furthermore, the chambers can be clustered so as to provide automatic processing.

Figure 6:
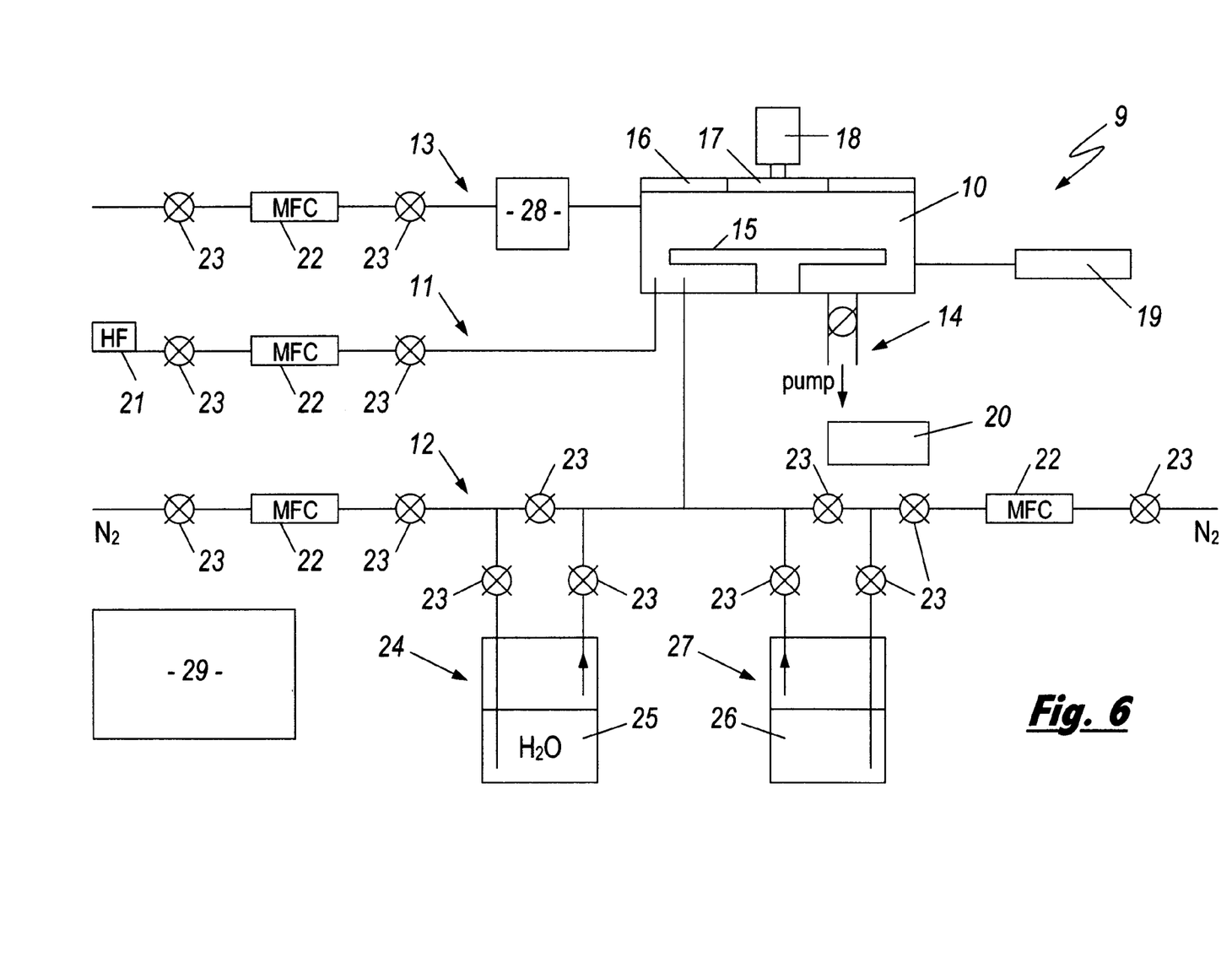
FIG. 6 presents a schematic representation of a process chamber system suitable for carrying out the method of releasing a feature from a MEMS structure in accordance with an aspect of the present invention.

FIG. 6 presents a schematic representation of an etching apparatus 9 employed for etching the MEMS structure 1 in accordance with the above described method. The etching apparatus 9 can be seen to comprise an etching chamber 10 attached to which are three input lines 11, 12 and 13, and an output vacuum line 14.

Within the etching chamber 10 is a temperature controlled pedestal 15 suitable for locating the MEMS structure 1 to be etched within the chamber 10. The chamber 10 itself can be seen to comprise a lid 16 so as to facilitate user access to the inside of the chamber 10. Located centrally within the lid 16 is a Zinc Selenide (ZnSe) window 17 that provides a means for maintaining the vacuum integrity of the chamber 10 but which permits infrared radiation to be transmitted from within the chamber 10.

The etching apparatus 9 further comprises a pyrometer 18 that is located externally to the chamber 10 and which is coincident with the ZnSe window. The pyrometer 18 is located such that the inherent, associated optimal focal length of the pyrometer 18 for maximising the capture of light, coincides with the distance between the pyrometer 18 and the MEMS structure 1 located on the pedestal 15. At this optimal operating distance the sensitivity of the pyrometer 18 is maximised. The operating wavelength of the pyrometer 18 is generally 8-12 μm and as such the pyrometer 18 can be employed to monitor the infrared radiation and hence temperature of the MEMS structure 1, as described in detail by the authors within PCT Application No. PCT/GB2006/000140.

The pedestal 15, upon which the MEMS structure 1 is located, can be set and maintained at a pedestal temperature $T_P$, by a temperature controller. This temperature may be above or below room temperature, the particular temperature being selected to optimise the etching process (typically 20-40° C.). In addition, during the etching process the walls of the chamber 10 are heated, typically to ~70° C.

The pressure of the etchant gas within the chamber 10, $P_C$, is monitored by a chamber pressure controller 19. The pressure controller 19 also incorporate a gas flow controller employed to provide a means of controlling the pressure within the chamber 10 by controlling the operation of a vacuum pumping system 20 located on the vacuum line 14.

HF vapour 21 is controllably supplied to the chamber 10 by the first input line 11 through a mass flow controller (MFC) 22 located between two valves 23.

Controlled quantities of water and/or alcohol are supplied to the chamber 10 by the second input line 12. In particular, a nitrogen carrier gas is supplied to a first bubbler apparatus 24 containing a water 25 so as to provide a means for transporting a desired quantity of water to the chamber 10. The flow of the nitrogen carrier gases through the first bubbler 24 is controlled by a combination of a MFC 22 and a series of valves 23. In a similar manner a nitrogen carrier gas is also employed to transport alcohol from an alcohol source 26 located within a second bubbler apparatus 27 to the chamber 10.

The third input line 13 provides a means for supplying a highly reactive plasma chemistry and/or an organic vapour to the chamber 10 from a remote plasma or organic vapour source 28. The plasma may be employed to oxidise the silicon oxide layer 2 so as to increase its hydrophobic characteristics, or to react with any residues e.g. boron and phosphorus, so as to produce a volatile gaseous compound which can simply be pumped away by the vacuum system 20.

The introduction of an organic vapour can be employed to address the problematic issue of exposure of underlying surfaces, which are hydrophobic and susceptible to water beading effects. Alternatively, if the underlying exposed surface is susceptible to corrosion then the organic vapour can be employed to render this surface hydrophobic. Both of these process are described in detail above.

A computer controller 29 is employed to automate the regulation of the various components and parameters of the chamber 10 e.g. the supply of nitrogen carrier gas, HF vapour, chamber temperatures and pressure etc.

In order to allow the described method of etching to proceed it is necessary to obtain a diagnostic that allows for the accurate monitoring of the condensed fluid layer 5. As described above, the physical properties of the condensed fluid layer 5 directly affect the etching rate on the MEMS structure 1 thus by monitoring the etch rate a direct diagnostic of the physical properties of the condensed fluid layer 5 is obtained.

In practice the etch rate can be monitored in numerous ways, e.g. by monitoring the level of by-products produced, by monitoring the wafer etch directly, by monitoring a change in chamber conditions or by measuring the wafer temperature. In the presently described embodiment a remote temperature measurement is employed to monitor the etch rate.

Initially the MEMS structure 1 is set at a predetermined temperature on the pedestal, ~30° C. The reaction described by Equation (1) is exothermic, thus by employing the pyrometer 18 to monitor the wafer temperature during the etch, the wafer temperature provides a means of monitoring the etch rate and hence the physical properties of the condensed fluid layer 5.

In alternative embodiments of the above described methods and apparatus it is found to be beneficial to monitor the temperature of the sample $T_S$ at various sites across the sample so as to be able to monitor the condensed fluid layer 5 at these various sites. One way to achieve this is by using a thermal imager built into the lid 16 instead of the pyrometer 18 so providing a means for viewing the surface of the MEMS structure 1. A second approach is to employ an array of pyrometers 18 distributed on the lid 16 so as to provide a means for viewing different points on the MEMS structure 1. However, it will be appreciated by those skilled in the art that any technique to measure the temperature of the sample can alternatively be employed.

Employing the etching apparatus 9 a MEMS structure 1 is etched by the following method. The temperature of the MEMS structure 1 is set to 30° C. and the pyrometer 18 employed to monitor its temperature and hence the formation of the condensed fluid layer 5. Controlled levels of HF vapour 21 and water 25 are then introduced to the chamber 10 to initiate the etching process. As the etch proceeds the amounts of HF vapour 21, water 25 and alcohol 26 are controlled, along with the pressure of the chamber $P_c$, so as to ensure that the condensed fluid layer 5 is only present on the silicon oxide layers 2 to be etched. As the etch progresses the ratio of water to alcohol present, and the process chamber 10 conditions e.g. chamber pressure, are regulated so as to control the properties of the condensed fluid layer 5 throughout the etching process.

In practice, it is found that a small amount of water vapour can be required to initiate the etch. However, as the etch continues the primary source of the water is that produced as a by-product or the reaction, as highlighted by Equation (1). Since etching requires the presence of a source of water vapour the etching process is effectively restricted to the surface of the silicon oxide layer 2. The conditions at other parts of the sample 1 and chamber 10 are such that HF etching is suppressed.

In addition, it is found that corrosion within the MEMS structure 1 and the chamber 10 is found to exhibit a photochemical effect. It is therefore beneficial for the process chamber 10 to be completely dark during the etching process so as to ensure that detrimetmental photochemical effects do not come into play.

The structure being etched will determine the etch regime used and therefore the chamber set-up required. For example, large structures will be able to accommodate a certain thickness of condensed fluid layer 5 while a more fragile structure may require a thinner, or even gaseous, condensed fluid layer 5 The process can be tailored to the structures and materials being fabricated.

The present invention offers several advantages over those systems described in the prior art. In the first instance the accurate control of the condensed fluid layer provides a reliable method for releasing a feature from a microstructure that is not susceptible to the effects of stiction, as is the case for so called wet etching techniques and dry etching techniques that employ a water catalyst. In addition, this is achieved while still maintaining an etch rate of the order of ~3,000 Å/min, which is of an acceptable level for use in a commercial application, unlike those so called dry etching techniques described in the art that employ an alcohol catalyst. Furthermore, as the condensed fluid layer is restricted to the exposed surfaces that are to be etched the effects of corrosion on other surfaces of the microstructure, and the process chamber itself, are significantly reduced.

The described method is also highly flexible and therefore can be readily adapted for use with a range of microstructures e.g. MEMS structures, containing a range of silicon oxide layers to be etched.

Incorporation of the plasma unit also has the benefit of allowing the silicon oxide layer to be oxidised, if required, or for reactive plasma chemistry to be introduced to the chamber so as to remove any unwanted residues from the microstructures.

Organic vapours may also be introduced so as to reduce the effects of beading so as to reduce the risk of capillary induced stiction or to render surface susceptible to corrosion as being hydrophobic.

The foregoing description of the invention has been presented for purposes of illustration and description and is not intended to be exhaustive or to limit the invention to the precise form enclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A method of releasing, in an etch process, a microstructure comprising a silicon oxide layer located between a substrate layer and a layer to be released from the silicon oxide layer, the method comprising;

exposing the silicon oxide layer to a hydrogen fluoride vapour in a process chamber, thereby forming a primary source of water and a condensed fluid layer on the silicon oxide layer;

adding water vapour to the process chamber as a secondary source of water, in order to maintain a depth of at least 10 Å of the condensed fluid layer, wherein the water content of the condensed fluid layer is predominantly from the primary water source and not the secondary water source; and controlling one or more of a partial pressure of the hydrogen fluoride vapour, a partial pressure of water vapour, or a chamber pressure such that the condensed fluid layer is substantially confined to exposed surfaces of the silicon oxide layer, with substantially no condensed fluid layer produced at unwanted sites within the microstructure, including exposed surfaces of the substrate layer and the layer to be released from the silicon oxide layer;

wherein a supply of water vapour to the process chamber is controlled independently of the supply of hydrogen fluoride vapour to the process chamber.

2. A method of releasing a microstructure as claimed in claim 1 wherein the method further comprises the formation of the condensed fluid layer having a depth of at least 100 Å.

3. A method of releasing a microstructure as claimed in claim 1 wherein the method further comprises the formation of the condensed liquid layer having a depth less than a predetermined maximum value.

4. A method of releasing a microstructure as claimed in claim 1 wherein the method further comprises the step of monitoring a depth of the condensed fluid layer.

5. A method of releasing a microstructure as claimed in claim 3 wherein the method further comprises the step of adjusting one or more process chamber parameters so as to maintain the depth of the condensed liquid layer between 10 Å and the predetermined maximum value.

6. A method of releasing a microstructure as claimed in claim 4 wherein the step of monitoring the depth of the condensed liquid layer comprises the step of monitoring an etch rate of the silicon oxide layer.

7. A method of releasing a microstructure as claimed in claim 6 wherein the step of monitoring the etch rate comprises monitoring a temperature of the micromechanical structure.

8. A method of releasing a microstructure as claimed in claim 5 wherein the step of adjusting one or more process chamber parameters comprises the selection of one or more steps from the group of steps comprising:
 a) altering the temperature of the micromechanical structure;
 b) altering the process chamber pressure;
 c) altering the partial pressure of the water vapour;
 d) exposing the silicon oxide layer to an alcohol vapour; and
 e) altering the partial pressure of the HF vapour.

9. A method of releasing a microstructure as claimed in claim 1 wherein the method further comprises the step of oxidising the exposed surfaces of the silicon oxide layer.

10. A method of releasing a microstructure as claimed in claim 9 wherein the step of oxidising the exposed surfaces of the silicon oxide layer comprises exposing these surfaces to an oxygen plasma.

11. A method of releasing a microstructure as claimed in claim 1 wherein the method further comprises the step of exposing the microstructure to a reactive plasma chemistry.

12. A method of releasing a microstructure as claimed in claim 1 wherein the method further comprises the step of introducing an organic vapour to a surface exposed by the etching process so as to render this surface hydrophilic.

13. A method of releasing a microstructure as claimed in claim 12 wherein the organic vapour is 2-[methoxy(polyethyleneoxy)propyl]heptamethyltrisiloxane.

14. A method of releasing a microstructure as claimed in claim 1 wherein the method further comprises the step of introducing an organic vapour to a surface exposed by the etching process so as to render this surface hydrophobic.

15. A method of releasing a microstructure as claimed in claim 14 wherein the organic vapour is selected from the group consisting of tridecafluoro-1,1,2,2-tetrahydrodecyltrichlorosilane and heptadecafluoro-1,1,2,2-tetrahydrodecyltrichlorosilane.

16. A method of releasing, in an etch process, a microstructure comprising a silicon oxide layer located between a substrate layer and a layer to be released from the silicon oxide layer, the method comprising;
 oxidising an exposed surface of the silicon oxide layer by exposing the exposed surface to one of an oxygen plasma or a reactive plasma chemistry;
 exposing the oxidised silicon oxide layer to a hydrogen fluoride vapour in a process chamber, thereby forming a primary source of water and a condensed fluid layer on the oxidised silicon oxide layer;
 adding water vapour to the process chamber as a secondary source of water, in order to maintain a depth of at least 10 Å of the condensed fluid layer, wherein the water content of the condensed fluid layer is predominantly from the primary water source and not the secondary water source;
 controlling one or more of a partial pressure of the hydrogen fluoride vapour, a partial pressure of water vapour, or a chamber pressure such that the condensed fluid layer is substantially confined to exposed surfaces of the silicon oxide layer, with substantially no condensed fluid layer produced at unwanted sites within the microstructure, including exposed surfaces of the substrate layer and the layer to be released from the silicon oxide layer;
 wherein a supply of water vapour to the process chamber is controlled independently of the supply of hydrogen fluoride vapour to the process chamber.

* * * * *

UNITED STATES PATENT AND TRADEMARK OFFICE
CERTIFICATE OF CORRECTION

| | |
|---|---|
| PATENT NO. | : 8,679,354 B2 |
| APPLICATION NO. | : 12/375745 |
| DATED | : March 25, 2014 |
| INVENTOR(S) | : O'Hara et al. |

Page 1 of 1

It is certified that error appears in the above-identified patent and that said Letters Patent is hereby corrected as shown below:

Title Page 2, Column 2, Item (56) OTHER PUBLICATIONS
Line 1, change "P. P R. Scheeper" to --P.R. Scheeper--

In the Specification

Column 1
Line 60, change "surface forces" to --surface, forces,--

Column 2
Line 48, change "van der Walls" to --van der Waals--

Column 6
Line 7, change "($H_2O$) 6" to --($H_2O$) 6--

Column 9
Line 66, change "layer 5 The" to --layer 5. The--

Signed and Sealed this
Tenth Day of February, 2015

Michelle K. Lee
*Deputy Director of the United States Patent and Trademark Office*